(12) United States Patent
Kuwazawa (10) Patent No.: US 7,342,270 B2
(45) Date of Patent: Mar. 11, 2008

(54) SOLID STATE IMAGING SYSTEM AND DRIVING METHOD THEREOF

(75) Inventor: Kazunobu Kuwazawa, Nagano (JP)

(73) Assignee: Seiko Epson Corporation (JP)

( * ) Notice: Subject to any disclaimer, the term of this patent is extended or adjusted under 35 U.S.C. 154(b) by 3 days.

(21) Appl. No.: 11/207,057

(22) Filed: Aug. 18, 2005

(65) Prior Publication Data

US 2006/0060897 A1    Mar. 23, 2006

(30) Foreign Application Priority Data

Sep. 22, 2004    (JP)    ............... 2004-274627

(51) Int. Cl.
*H01L 31/062* (2006.01)
(52) U.S. Cl. ............ 257/292; 257/443; 257/448; 257/291
(58) Field of Classification Search ........ 257/290–294, 257/435, 443, 448
See application file for complete search history.

(56) References Cited

U.S. PATENT DOCUMENTS

| | | | | |
|---|---|---|---|---|
| 6,051,857 | A * | 4/2000 | Miida | .......... 257/292 |
| 6,448,596 | B1 * | 9/2002 | Kawajiri et al. | .......... 257/292 |
| 6,914,228 | B2 * | 7/2005 | Yato | .......... 250/208.1 |
| 7,061,033 | B2 * | 6/2006 | Takamura | .......... 257/292 |
| 7,067,860 | B2 * | 6/2006 | Yato | .......... 257/292 |

FOREIGN PATENT DOCUMENTS

| | | |
|---|---|---|
| JP | 58-050874 | 3/1983 |
| JP | 05-243546 | 9/1993 |
| JP | 2002-064751 | 2/2002 |
| JP | 2002-134729 | 5/2002 |
| JP | 2002-368201 | 12/2002 |
| JP | 2004-087963 | 3/2004 |

* cited by examiner

*Primary Examiner*—Mary Wilczewski
*Assistant Examiner*—Tsz Chiu
(74) *Attorney, Agent, or Firm*—Harness, Dickey & Pierce, P.L.C.

(57) ABSTRACT

A solid state imaging system includes a plurality of amplifying units that are placed one by one for every pair of photoelectric conversion areas. Each amplifying unit is placed side-by-side in one direction of a two-dimensional matrix for outputting a pixel signal according to a photogenerated charge retained in a floating diffusion area. A plurality of transfer controlling elements are placed in pairs for each pair of the photoelectric conversion areas for controlling the transfer of the photogenerated charge by changing a potential barrier of a photogenerated charge transfer route between each of the accumulation wells in the pair of photoelectric conversion areas and the corresponding floating diffusion area. A plurality of transfer gate lines are connected to each of the transfer controlling elements in the plural photoelectric conversion areas that are aligned in the other direction of the two-dimensional matrix.

5 Claims, 6 Drawing Sheets

SOLID STATE IMAGING SYSTEM AND DRIVING METHOD THEREOF

RELATED APPLICATIONS

This application claims priority to Japanese Patent Application No. 2004-274627 filed Sep. 22, 2004 which is hereby expressly incorporated by reference herein in its entirety.

BACKGROUND OF THE INVENTION

1. Technical Field

The present invention relates to a solid state imaging system and its driving method.

2. Related Art

As a solid state imaging system to be loaded on mobile phones, digital still cameras and the like, there is a CCD (charge coupled device) image sensor (hereinafter, simply referred to as a "CCD sensor") and a CMOS image sensor (hereinafter, simply referred to as a "CMOS sensor").

In recent years, a MOS imaging system depending on a threshold voltage shift (hereinafter, simply referred to as a "substrate modulation sensor") that provides high picture quality and low power consumption is proposed. Japanese Patent Application Publication 2002-134729 proposes an example of a substrate modulation sensor.

A CCD sensor consumes a large amount of power because the driving voltage is high. Meanwhile, a CCD sensor achieves a CDS (correlated double sampling) feature for noise reduction and a so-called synchronous electronic shutter feature for imaging a fast moving object without distortion. The synchronous electronic shutter feature avoids distortion in an image of an object by simultaneously accumulating the photogenerated charge of a plurality of photoreceiving elements that is aligned two-dimensionally. Therefore, a CCD sensor has generally an advantage of providing high picture quality.

Meanwhile, among CMOS sensors, a CMOS-APS (Active Pixel Sensor) sensor composed of four transistors achieves a CDS feature, although without a synchronous electronic shutter feature. A CMOS sensor has an advantage of low power consumption and low process cost because the driving voltage is generally low. In a general CMOS-APS sensor, a synchronous electronic shutter feature can not be achieved because, on each of the readout lines, a floating diffusion (hereinafter, simply referred to as an "FD"), which is a charge conservation area, must be reset first to read out a noise component and then to read out a signal component, so as to achieve a CDS feature.

Specifically, in a CMOS-APS sensor, for achieving a CDS feature, transistors for transferring charge are sequentially reset on each of the selected lines for reading out pixel signals, first to read out a noise component and then to read out a signal component. Signal components are sequentially read out while being reset on each of the selected lines. Therefore, in the imaging of a fast moving object, there occur gradual gaps in the readout times from the first readout line through the last readout line, causing distortion in a resulting image of an object.

Although it is possible to achieve a synchronous electronic shutter in a CMOS-APS sensor, the above-referenced transistors for transferring charge are used to achieve a synchronous electronic shutter feature. Therefore, the achieving of a synchronous electronic shutter feature in a CMOS-APS sensor precludes the achieving of a CDS feature, causing a problem of picture quality degradation.

Further, in a substrate modulation sensor disclosed in the above-referenced Japanese Patent Application Publication 2002-134729, a signal component is first read out and then a noise component is read out after a reset, the difference between the two signal components being output as a pixel signal.

In a substrate modulation sensor, the readout signal component includes a noise component that remained after the last reset, and a noise component to be read out subsequently is a noise component that remained after the reset. The amount of the noise component that remained after the last reset and is included in the signal component is not necessarily equal to the amount of the noise component that remained after the subsequent reset. Specifically, an output pixel signal includes a previous noise component but not a concurrent noise component. Therefore, in a substrate modulation sensor, there is no correlation between a signal component and a noise component, causing a shortcoming that noise is not filtered out precisely, which leads to picture quality degradation.

A technology to achieve a synchronous electronic shutter also in a substrate modulation sensor is proposed, for example, in Japanese Patent Application Publication 2004-87963. In a technology according to the proposal, all the pixels are synchronously reset and then pixel signals are read out sequentially on each of the lines.

Further, in a substrate modulation sensor according to the proposal, a ring gate is used on a modulation transistor. Each of the plural sensor cells that are aligned on a substrate in a two-dimensional matrix has one ring gate for one photodiode.

However, in a technology that is described in the above-referenced Japanese Patent Application Publication 2004-87963, the problem that noise is not filtered out precisely still remains because there is no correlation between a signal component and a noise component as, in the reading out of a pixel signal, a signal component is first read out and then a noise component is read out after a reset.

Further, in a substrate modulation sensor according to the above-referenced two proposals, a certain amount of interval is needed between a ring gate and a drain on a modulation transistor. Therefore, as for a substrate modulation sensor, there is a problem that a substrate modulation sensor can not be downsized because a ring gate needs a certain amount of width.

SUMMARY

An advantage of the invention is to provide a solid state imaging system that can achieve a synchronous electronic shutter feature as well as a CDS feature while achieving downsizing of a cell pitch.

A first aspect of the invention is to provide a solid state imaging system that has in a substrate a plurality of accumulation wells for accumulating photogenerated charge that is generated on a photoelectric conversion area according to an incident light, the plural photoelectric conversion areas being aligned on the substrate in a two-dimensional matrix. The solid state imaging system includes: a plurality of amplifying units that is placed one by one for every pair of photoelectric conversion areas, each of which is placed side-by-side in one direction of the two-dimensional matrix, for outputting a pixel signal according to the photogenerated charge retained in a floating diffusion area, a plurality of transfer controlling elements that is placed in pairs for each pair of the photoelectric conversion areas for controlling the transfer of the photogenerated charge by changing a potential barrier of a photogenerated charge transfer route between each of the accumulation wells in the pair of photoelectric conversion areas and the corresponding floating diffusion area, and a plurality of transfer gate lines that is connected to each of the transfer controlling elements in the plural photoelectric conversion areas that are aligned in the other direction of the two-dimensional matrix, wherein each of the plural transfer controlling elements has a transfer gate placed on a substrate surface via an insulating film and a charge retention area for retaining the photogenerated charge in the substrate and beneath the transfer gate, while the plural amplifying units are respectively a transistor and the form of a gate of the transistor is approximately ring-shaped respectively, each gate being placed on a carved-out part of each pair of the gates, each of which is placed side-by-side in one direction of the two-dimensional matrix in a manner of being interposed at least in part.

According to the configuration, a solid state imaging system can be achieved wherein a synchronous electronic shutter as well as a CDS feature can be achieved while cell pitches can be downsized and transferring on transfer gate lines can be separately controlled on each line.

In a solid state imaging system of the invention, it is preferable that the amplifying unit is a modulation transistor that outputs the pixel signal according to the charge while a threshold voltage of a channel is controlled by the charge retained in the floating diffusion area.

According to the configuration, in a substrate modulation sensor, a synchronous electronic shutter as well as a CDS feature can be achieved while cell pitches can be downsized.

In a solid state imaging system of the invention, it is preferable that a diffusion layer, which works as a transfer route between the floating diffusion area and the charge retention area, is placed beneath other diffusion layers of the substrate.

According to the configuration, the occurrence of dark current can be suppressed.

Further, in a solid state imaging system of the invention, it is preferable that a discharging unit is included for discharging an unnecessary charge in the accumulation wells. According to the configuration, an unnecessary charge can be definitely discharged.

A second aspect of the invention is to provide a solid state imaging system that has in a substrate a plurality of accumulation wells for accumulating photogenerated charge that is generated on a photoelectric conversion area according to an incident light, the plural photoelectric conversion areas being aligned on the substrate in a two-dimensional matrix. The solid state imaging system includes: a plurality of amplifying units that is placed one by one for every pair of photoelectric conversion areas, each of which is placed side-by-side in one direction of the two-dimensional matrix, for outputting a pixel signal according to the photogenerated charge retained in a floating diffusion area, a plurality of transfer controlling elements that is placed in pairs for each pair of the photoelectric conversion areas for controlling the transfer of the photogenerated charge by changing a potential barrier of a photogenerated charge transfer route between each of the accumulation wells in the pair of photoelectric conversion areas and the corresponding floating diffusion area, and a plurality of transfer gate lines that is connected to each of the transfer controlling elements in the plural photoelectric conversion areas that are aligned in the other direction of the two-dimensional matrix, wherein each of the plural transfer controlling elements has a transfer gate placed on a substrate surface via an insulating film and a charge retention area for retaining the photogenerated charge in the substrate and beneath the transfer gate, while the plural amplifying units are respectively a transistor and the form of a gate of the transistor is approximately ring-shaped respectively, each gate being placed on a carved-out part of each pair of the gates, each of which is placed side-by-side in one direction of the two-dimensional matrix in a manner of being interposed at least in part, the solid state imaging system also including: accumulating in the accumulation wells the photogenerated charge, simultaneously for all the pixels, by controlling the potential barrier of the transfer route with the transfer controlling elements as a way of at least preventing it from flowing into the charge retention area via the transfer route, a first transferring of the photogenerated charge accumulated on the accumulation wells to the charge retention area, simultaneously for all the pixels, by controlling the potential barrier of the transfer route with the transfer controlling elements, a first reading out of a noise component from the transistor by controlling the voltage on the two gates that are placed corresponding to the pair of photoelectric conversion areas in one direction of the matrix, a second transferring of the photogenerated charge from one of the two charge retention areas of the two transfer controlling elements corresponding to the pair of photoelectric conversion areas to the floating diffusion area in one direction of the matrix, and a second reading out of a signal component from the transistor according to the transferred photogenerated charge by controlling the voltage on the gates that are placed corresponding to the pair of photoelectric conversion areas in one direction of the matrix.

According to the configuration, a solid state imaging system can be achieved wherein a synchronous electronic shutter as well as a CDS feature can be achieved while cell pitches can be downsized and transferring on transfer gate lines can be separately controlled on each line.

BRIEF DESCRIPTION OF THE DRAWINGS

The invention will be described with reference to the accompanying drawings, wherein like numbers refer to like elements, and wherein.

DESCRIPTION OF THE EMBODIMENTS

Figure 1:
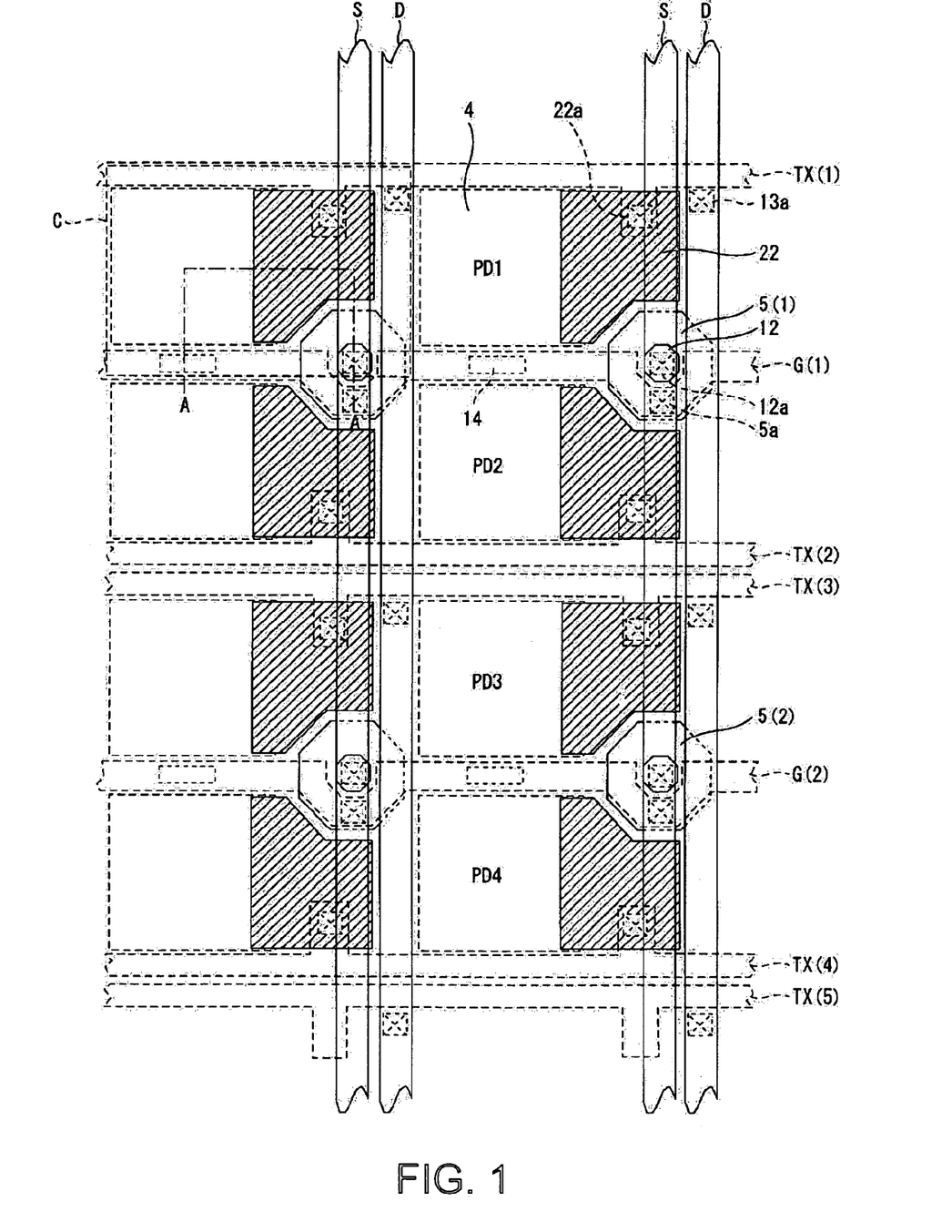
FIG. 1 is a two-dimensional diagram showing a plane form of a solid state imaging system according to an embodiment of the invention.
Figure 2:
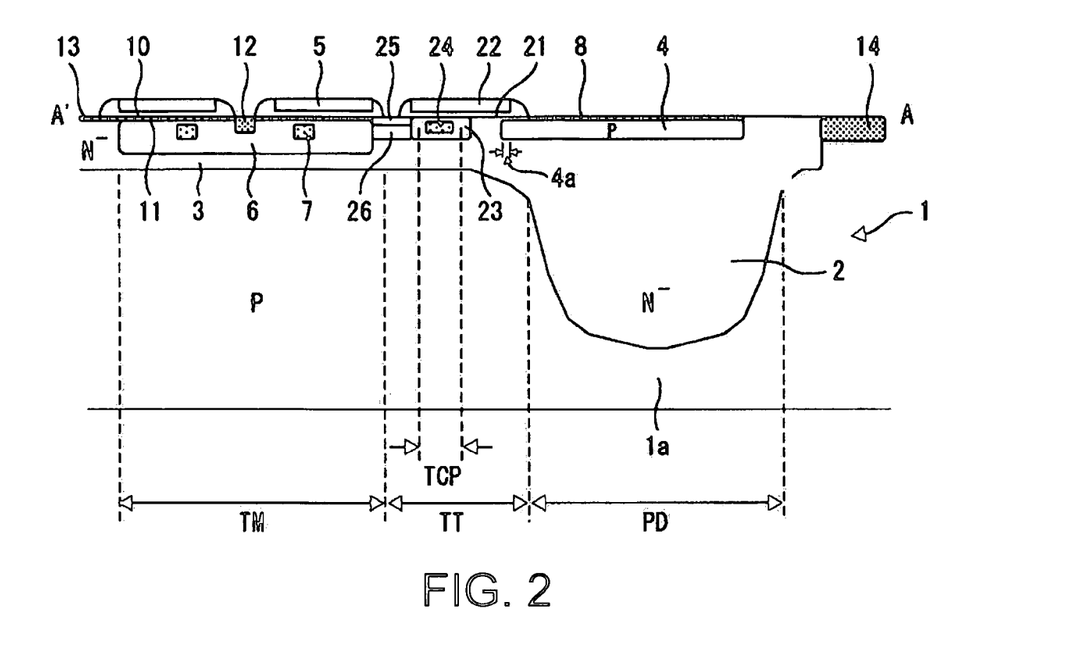
FIG. 2 is a sectional view along line A-A' in FIG. 1.

Embodiments of the invention will now be described with reference to the drawings. First, the configuration of a solid state imaging system according to an embodiment of the invention will be described. FIG. 1 is a two-dimensional diagram showing a plane form of a solid state imaging system according to the embodiment. FIG. 2 is a sectional view along line A-A' in FIG. 1.

As shown in FIG. 1, a solid state imaging system of the embodiment is a sensor cell array on which a plurality of sensor cells is aligned on a substrate surface in a two-dimensional matrix. Each sensor cell accumulates photogenerated charge generated according to an incident light, outputting a pixel signal at a certain level according to the accumulated photogenerated charge. Pixel signals for one screen can be obtained by aligning sensor cells in a matrix. In FIG. 1, the area shown with a dashed line is a sensor cell C, which is a unit pixel. Each sensor cell has a photodiode forming area PD, which is a photoelectric conversion area. A solid state imaging system according to the embodiment is a substrate modulation sensor. Eight sensor cells are shown in FIG. 1. Four sensor cells of the eight sensor cells are respectively shown as a photodiode forming area PD1 to PD4 (hereinafter, each photodiode forming area is simply referred to as a "PD"). A photodiode forming area PD1 will be described in the following explanation, as the configuration of each sensor cell is same. In the embodiment, holes are used as photogenerated charge. Electrons can be also used as photogenerated charge in the configuration.

As shown in FIG. 2, a modulation transistor forming area TM is set up corresponding to a photodiode forming area PD. As shown in FIG. 1, two photodiode forming areas PD are set up for one modulation transistor forming area TM. Two transfer transistor forming areas TT for transferring charge from each of the photodiode forming areas PD to one modulation transistor forming area TM are set up between each of the photodiode forming areas PD and the modulation transistor forming area TM.

According to the embodiment, a transfer transistor Tr that is formed on a transfer transistor forming area TT is driven on each of the selected lines to transfer charge (photogenerated charge) that is accumulated on each of the photodiode forming areas PD to a modulation transistor forming area TM.

The configuration of a solid state imaging system according to the embodiment will be described more in detail by using FIGS. 1 and 2. As shown in FIG. 1, the plural photodiode forming areas PD that are placed in a matrix are approximately rectangle respectively.

The photodiode forming areas PD are formed between source lines S and drain lines D that are set up along the lengthwise direction of the two-dimensional matrix and transfer gate lines TX(1), TX(2), TX(3) . . . and gate lines G(1), G(2), G(3) . . . that are set up along the crosswise direction. Although the gate lines G are set up in a straight line in the crosswise direction, they are formed, on the part of a gate 5 (to be described later), in a curve along the form of the gate 5, which is approximately ring-shaped.

As shown in FIG. 2, each sensor cell is formed on a P-type substrate 1a. A N-type well, which is N−, is formed in a deep position in the substrate, on the P-type substrate 1a on a photodiode forming area PD. Meanwhile, on a P-type substrate 1a on a modulation transistor forming area TM, an N-type well 3, which is N−, is formed in a relatively shallow position of the substrate. Here, in FIG. 2 and its explanation, the suffixes "−" and "+" to N and P signify the density of impurities, the suffix "−−" signifying a more sparse part and the suffix "++" signifying a more dense part.

On a N-type well 2 on the photodiode forming area PD, a P-type impurity layer is formed almost all over the photodiode forming areas PD, the P-type impurity layer working as an accumulation well 4. An N+ diffusion layer 8, which works as a pinning layer, is formed almost all over the surface side of the photodiode forming area PD. On the photodiode forming area PD, an orifice area is formed on the surface of the substrate 1, and an accumulation well 4, which is a P-type well and wider than the orifice area, is also formed.

A depletion area is formed on a border area between the N-type well 2 and the P-type accumulation well 4 that are formed on the substrate 1 beneath the photodiode forming area PD having a function as a photoelectric transducer. On the depletion area, photogenerated charge is generated by an incident light through the orifice area that receives light on the photodiode forming area.

As a modulation transistor Tm formed on a modulation transistor forming area TM as an amplifying unit, an N channel depression MOS transistor is used, for example. On the N-type well 3 on the modulation transistor forming area TM, a gate 5 (hereinafter, referred to as a "ring gate" or simply as a "gate"), which is approximately ring-shaped (an octagon in FIGS. 1 and 3), is formed on the surface of the substrate 1 via a gate insulating film 10 (shown as a gate 5(1) in FIG. 1). An N+ diffusion layer 11 composing a channel is formed on the substrate surface beneath the ring gate 5. On the center substrate surface of the orifice part of the ring gate 5, an N++ diffusion layer is formed, forming a source area 12 (hereinafter, sometimes simply referred to as a "source"). On the N-type well 3 on the modulation transistor forming area TM, a P-type impurity layer is formed approximately in accordance with the outside diameter shape of the ring gate 5 that composes the modulation transistor. The P-type impurity layer works as a modulation well 6. A carrier pocket 7, which is ring-shaped formed in accordance with the ring shape of the ring gate 5 and is a P-type impurity layer of high concentration and a floating diffusion area by P+ diffusion, is formed in the modulation well 6.

Further, a N+ diffusion layer is formed on the substrate surface around the ring gate 5, composing a drain area 13 (hereinafter, sometimes simply referred to as a "drain"). The N+ diffusion layer 11 composing a channel is connected to a source area 12 and a drain area 13.

The modulation well 6 controls a threshold voltage of the channel of the modulation transistor Tm. The modulation transistor Tm is composed of a modulation well 6, a ring gate 5, a source area 12, and a drain area 13. A threshold voltage of a channel changes according to the charge that is accumulated on the carrier pocket 7.

Further, as shown in FIG. 1, on a predetermined position of the ring gate 5, an N+ layer gate contact area 5a is formed in the proximity of the surface of the substrate 1. On a predetermined position of the source area 12, an N+ layer source contact area 12a is formed in the proximity of the surface of the substrate 1. On a predetermined position of the drain area 13, an N+ layer drain contact area 13a is formed in the proximity of the surface of the substrate 1.

The charge accumulated on the accumulation well 4 is transferred to the modulation well 6 via a transfer transistor forming area TT (to be described later) and are retained in the carrier pocket 7. The source potential of the modulation transistor forming area TM, which works as a modulation transistor, corresponds to the amount of charge that is transferred to the modulation well 6, in other words, the incident light toward the photodiode forming area PD that works as a photodiode.

On the surface of the substrate 1 in the proximity of the accumulation well 4, a diffusion area 14 (hereinafter, simply referred to as an "OFD area") for discharging an unnecessary charge, including overflow charge, by a P++ diffusion layer of high concentration is formed. The OFD area 14 is an area for discharging, onto a substrate, an unnecessary charge that is not accumulated on the accumulation well 4 and is overflowed from the accumulation well 4 and that, in addition, does not contribute to a pixel signal (hereinafter, simply referred to as an "unnecessary charge").

A transfer transistor forming area TT will now be described. A transfer transistor forming area TT has, in a substrate, a carrier pocket TCP for temporarily retaining charge, as shown in FIG. 2.

Specifically, a transfer transistor forming area TT is formed, on the surface side of a substrate, between a photodiode forming area PD and a modulation transistor forming area TM within one sensor cell. The transfer transistor forming area TT has a transfer gate 22 on a substrate surface via a gate insulating film 21 so that a channel may be formed on the substrate surface. The channel on the transfer transistor forming area TT, which is a transfer route, is controlled by the impressed voltage on the transfer gate 22 and the voltage given to the N+ diffusion layer 25.

A carrier pocket TCP is set up beneath the transfer gate 22. In the carrier pocket TCP, a P-type impurity layer is formed on the N-type well 3 on the modulation transistor forming area TM, the P-type impurity layer working as an accumulation well for transferring 23. A carrier pocket for transferring 24 by P+ diffusion is formed in the accumulation well for transferring 23.

The transfer gate 22 is formed on the surface side of the substrate, set up on the surface via a gate insulating film 21 so that transfer gate 22 may partly cover the accumulation well 4 when seen from an orthogonal direction toward the substrate surface (as shown in 4a in FIG. 2).

Further, an N+ diffusion layer 25 is formed almost all over the surface side of the substrate between the accumulation well for transferring 23 and the modulation transistor forming area TM. A P-type diffusion layer 26 is formed beneath the N+ diffusion layer 25. The potential barrier of the transfer route 26 that is formed between the carrier pocket 24 beneath the transfer gate 22 and the carrier pocket 7 beneath the modulation transistor can be efficiently controlled by the N+ diffusion layer 25. Further, because the diffusion layer 26 can be embedded beneath the N+ diffusion layer 25, the N+ diffusion layer 25 can work as a pinning layer, suppressing the occurrence of dark current.

As shown in FIG. 1, the transfer gate 22 on the transfer transistor forming area TT has a shape approximately rectangle, alongside of one side of a rectangle photodiode forming area PD. In the embodiment, as shown in FIG. 1, because a ring gate 5 is set up in the proximity of one corner of the photodiode forming area PD, the part by the side of the ring gate 5 of the transfer gate 22 on the transfer transistor forming area TT has a shape that is partly carved out according to the shape of the ring gate.

Further, when seen from an orthogonal direction toward the substrate surface, a carrier pocket 24 (not shown in FIG. 1) is formed within the transfer gate 22 in FIG. 1. Moreover, as shown in FIG. 1, on a predetermined position of the transfer gate 22, an N+ layer gate contact area 22a is formed in the proximity of the surface of the substrate 1. Now, the alignment of a plurality of sensor cells will be described more in detail with reference to FIG. 1. As described above, a transfer transistor forming area TT is set up between a photodiode forming area PD and a corresponding modulation transistor forming area TM. The transfer gate 22 of a transfer transistor Tr on the transfer transistor forming area TT has a shape approximately rectangle, one part placed alongside of one side of a photodiode forming area PD and another part carved out according to the peripheral shape of the ring gate 5 (an octagon in FIG. 1). The transfer gate 22 is set up on the surface of the substrate 1 via a gate insulating film 21.

Further, as shown in FIG. 1, a photodiode forming area PD and a transfer transistor forming area TT, which have both a shape approximately rectangle, are set up within each of the sensor cells. As for a pair of transfer transistor forming areas TT placed side-by-side in the lengthwise direction, which is one direction of the two-dimensional matrix, one corner of each area has a shape that is carved out.

Here, the carved out parts on each area are placed side-by-side on the adjacent two transfer transistor forming areas TT.

Figure 3:
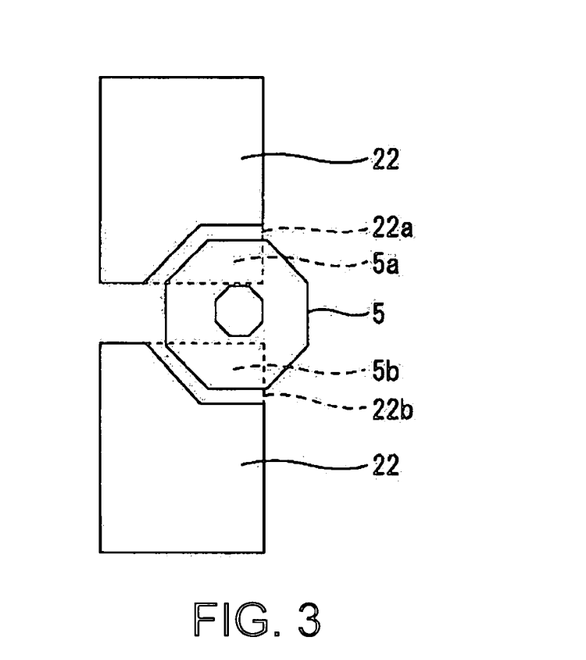
FIG. 3 is a two-dimensional diagram explaining the positioning of a ring gate according to an embodiment of the invention.

FIG. 3 is a two-dimensional diagram for explaining the positioning of the transfer gate 22 on the adjacent two transfer transistor forming areas TT and the ring gate 5. As shown in FIG. 3, a ring gate 5 is placed, for each of the transfer gates 22 on a pair of transfer transistor forming areas TT that are placed side-by-side in a lengthwise direction of the two-dimensional matrix, on a position interposed between the carved out parts 22a and 22b on the corners of two adjacent approximately rectangle areas.

In other words, a ring gate 5 is placed so that its parts 5a and 5b may overlap on the carved out corners 22a and 22b on the two transfer transistor forming areas TT, which are approximately rectangle, when the substrate 1 is seen from an orthogonal direction toward the substrate surface. Further, the ring gate 5 is included in the modulation transistor Tm that is formed on a modulation transistor forming area TM. Therefore, the modulation transistor Tm is set up one by one for each pair of transfer transistor forming areas TT that are placed side-by-side in one direction of the two-dimensional matrix.

Specifically, a transfer transistor Tr that is formed on a transfer transistor forming area TT is set up for each of the photodiode forming areas PD. A pair of transfer transistors Tr work as a transfer controlling element to control the transferring of photogenerated charge, by changing the potential barrier of each photogenerated charge transfer route between each of the accumulation wells 4 on the corresponding pair of photodiode forming areas PD and a corresponding modulation well 6.

Therefore, in one direction of the two-dimensional matrix (in the lengthwise direction in FIG. 1), one ring gate is set up for two sensor cells, that is, a pair of sensor cells. Thus, as shown in FIG. 1, one ring gate 5(1) is shared between the two photodiode forming areas PD1 and PD2. One ring gate 5(2) is shared between the next two photodiode forming areas PD3 and PD4. Hereinafter, two sensor cells sharing one ring gate is referred to as a pair of sensor cells. Therefore, when there are n pieces of lines (n is an integer) in one direction of the two-dimensional matrix, in the lengthwise direction, for example, in FIG. 1, n/2 pieces of ring gates are set up in that direction. Meanwhile, when a sensor cell array has pixels in n×m matrix, the number of ring gates 5 will be (n/2)×m.

Photodiode forming areas PD are formed between source lines S and drain lines D that are placed along the lengthwise direction of the two-dimensional matrix and transfer gate lines TX(1), TX(2), TX(3) . . . (hereinafter, each transfer gate is sometimes referred to as a "TX") and gate lines G(1), G(2), G(3) . . . (hereinafter, each gate line is sometimes referred to as a "G") that are placed along the crosswise direction. Specifically, each pair of sensor cells C is placed between the source lines S and drain lines D and transfer gate lines TX(1), TX(2), TX(3) . . . while a plurality of gate lines G(1), G(2), G(3) . . . is placed in a manner of passing through the two photodiode forming areas PD of each pair of sensor cells C. Therefore, in the embodiment, in the lengthwise direction, a transfer gate line TX(1) and a transfer gate line TX(n) are respectively placed on each end of the direction while a pair of transfer gate lines and a gate line G are alternately placed between the transfer gate lines on the both ends.

The gate line G(1) is placed corresponding to the first and the second lines of the matrix including the photodiode forming areas PD1 and PD2. The gate line G(2) is placed corresponding to the third and the fourth lines of the matrix including the photodiode forming areas PD3 and PD4. Specifically, a gate line G(k) is placed corresponding to the 2k-th and the (2k-1)-th lines of the matrix including the photodiode forming areas PD(2k) and PD(2k-1). Here, k is any integer in the range of 1 to (n/2). The gate lines G(1), G(2), G(3) . . . are formed curvedly along the shape of gates 5, which are approximately ring-shaped (to be described later).

Further, interconnection layers, including such as the above-referenced transfer gate lines TX(1), TX(2), TX(3) . . . and source lines S, are formed via interlayer insulating films (not shown) on the substrate surface. A transfer gate 22, a source contact area 12a, and the like are interconnected electrically to each interconnection in the interconnection layers through contact holes that are opened on the interlayer insulating films. Each interconnection is composed of metal materials such as aluminum.

Figure 4:
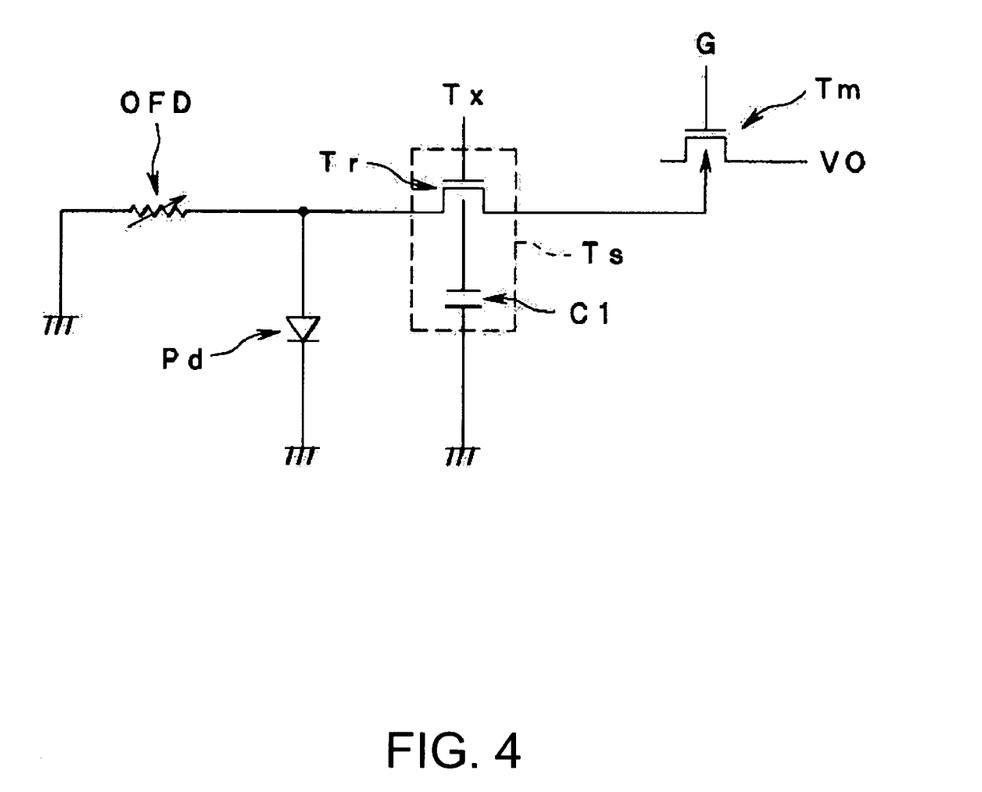
FIG. 4 is an equivalent circuit of a sensor cell on a solid state imaging system according to an embodiment of the invention.

FIG. 4 is an equivalent circuit of a sensor cell on a solid state imaging system according to the embodiment. A sensor cell C is composed of a photodiode Pd provided on a photodiode forming area PD, a modulation transistor Tm provided on a modulation transistor forming area TM, and a transistor Tr as a transfer controlling element provided on a transfer transistor forming areas TT.

The charge (photogenerated charge) generated on a photodiode Pd that does photoelectric transfer is transferred to a carrier pocket 7 of the modulation transistor Tm by controlling the voltage of the transfer gate 22 on the transistor Tr at a predetermined level.

At the modulation transistor Tm, charge retained in the carrier pocket 7 means a change of a backgate bias, leading to a change of the channel threshold voltage according to the amount of charge in the carrier pocket 7. Therefore, the output voltage VO of the modulation transistor Tm corresponds to the charge in the carrier pocket 7, in other words, to the brightness of an incident light toward the photodiode Pd.

Further, in FIG. 4, a variable resistor OFD connected to one edge of the photodiode Pd is shown. An OFD area 14, which changes a potential according to a given potential, is shown by the variable resistor OFD.

Figure 5:
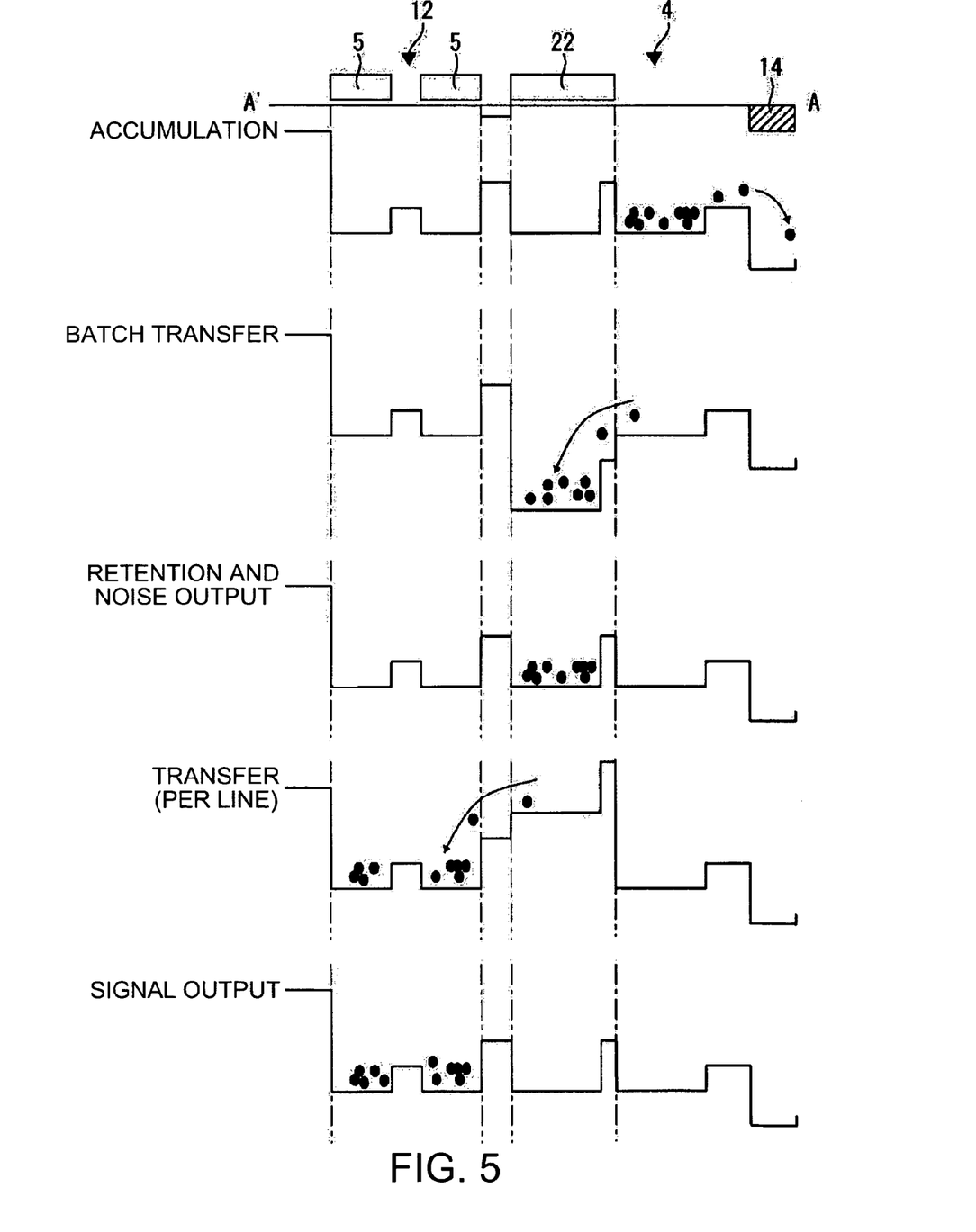
FIG. 5 is a potential diagram showing each mode of a solid state imaging system according to an embodiment of the invention.

FIG. 5 is a potential diagram showing the potential status in each mode of a solid state imaging system. In FIG. 5, from the top, potentials in an accumulation mode (M1), in a batch transfer mode (M2), in a retention and noise output mode (M3), in a transfer mode (M4), and in a signal output mode (M5) are respectively shown. In FIG. 5, the potential relationship in each mode is shown, with the increase of hole potentials being shown in a positive sense.

FIG. 5 shows the potential relationship at each position, with the horizontal axis, like in FIG. 2, corresponding to the line A-A' in FIG. 1 and the vertical axis corresponding to potentials on the basis of holes. In FIG. 5, from the left to the right, potentials in a substrate at one edge of the ring gate 5, at the source area 12, at the other edge of the ring gate 5, at the transfer gate 22 of the transfer transistor Tr, at the accumulation well 4, and at the OFD area 14 are respectively shown.

In an accumulation mode (M1), voltage is applied on the transfer gate 22 of the transfer transistor Tr so that a high potential barrier may be formed between the accumulation well 4 and the carrier pocket 24. The potential on the OFD area 14 is lower than the potential on the area for the transfer gate 22. This is to make the overflowed charge from the accumulation well 4 to be discharged onto the OFD area 14. Specifically, as an accumulation process, the photogenerated charge by the photoelectric transducer is accumulated in the accumulation well 4, simultaneously for all the pixels, by controlling the potential barrier in the transfer route with the gate voltage of the transfer transistor Tr as a way of at least preventing the charge from flowing into the carrier pocket 24 through the transfer route.

In a batch transfer mode (M2), a first predetermined low voltage is applied on the transfer gate 22 of the transfer transistor Tr so that a potential barrier may not be formed between the accumulation well 4 and the carrier pocket 24. Here, as the potential on the carrier pocket 24 is lower than the potential on the accumulation well 4, the charge accumulated in the accumulation well 4 flows into the carrier pocket 24. Specifically, as a batch transfer process, the photogenerated charge accumulated in the accumulation well 4 is transferred to the carrier pocket 24, simultaneously for all the pixels, by controlling the potential barrier in the transfer route with the gate voltage of the transfer transistor Tr.

In a retention and noise output mode (M3), voltage is applied on the transfer gate 22 of the transfer transistor Tr so that a high potential barrier may be formed between the accumulation well 4 and the carrier pocket 24. Thus, the charge flown into the carrier pocket 24 is retained in the carrier pocket 24. Further, as described later, reset and noise readout are done in this stage. Specifically, as a noise component modulation process, the noise component in the carrier pocket 7 is read out, preventing the photogenerated charge from flowing into the carrier pocket 7 by controlling the potential barrier in the transfer route with the gate voltage of the transfer transistor Tr.

In a transfer mode (M4) that is done on each line, a second predetermined high voltage is applied on the transfer gate 22 of the transfer transistor Tr so that a potential barrier may not be formed between the carrier pocket 24 and the modulation well 6. Here, as the potential on the carrier pocket 24 is lower than the potential on the modulation well 6, the charge accumulated in the carrier pocket 24 flow into the modulation well 6. Specifically, as a transfer mode process for each line, the photogenerated charge accumulated in the carrier pocket 24 is transferred to the carrier pocket 7 by controlling the potential barrier in the transfer route with the gate voltage of the transfer transistor Tr.

In a signal output mode (M5), voltage is applied on the transfer gate 22 of the transfer transistor Tr so that a high potential barrier may be formed between the carrier pocket 24 and the modulation well 6. Thus, the charge flown into the modulation well 6 is retained in the modulation well 6. Further, as described later, reading out of signal component is done in this stage. Specifically, as a signal component modulation process, a pixel signal according to the photogenerated charge is read out from the carrier pocket 7, retaining the photogenerated charge in the modulation well 6 by controlling the potential barrier in the transfer route with the gate voltage and the drain voltage of the transfer transistor Tr.

Figure 6:
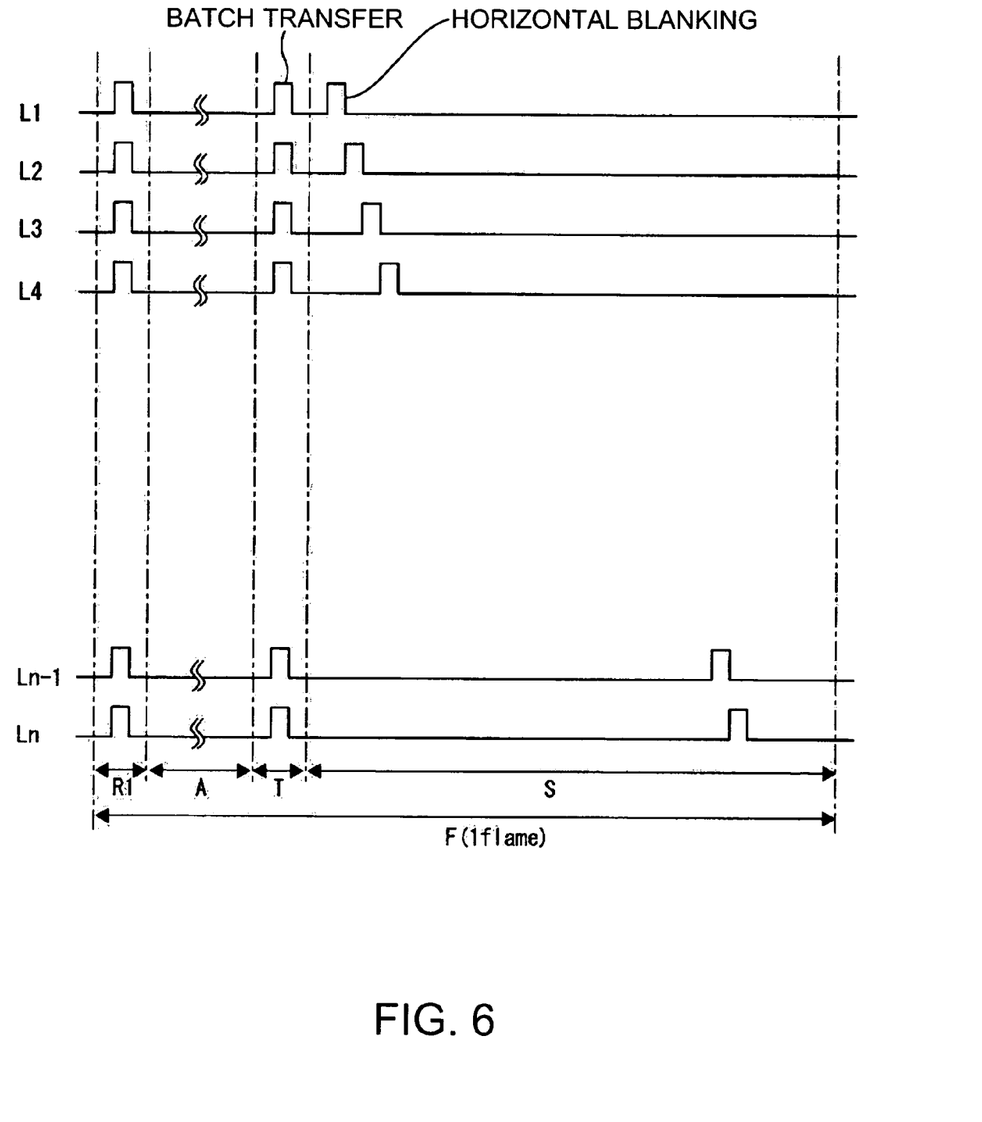
FIG. 6 is a timing chart showing a drive sequence of an embodiment of the invention.

Next, a method for driving a solid state imaging system of the above-referenced configuration will be described according to an operation sequence, using FIGS. 6 and 7. FIG. 6 is a timing chart showing a drive sequence of a solid state imaging system of the embodiment. As shown in FIG. 6, one frame period F includes four periods, which are a reset period (R1), an accumulation period (A), a batch transfer period (T), and a pixel signal readout period (S).

The reset period (R1) is a period for resetting all the pixels, that is, all the sensor cells, simultaneously at the start of one frame. The reset operation that is done in the reset period (R1) is an operation for discharging the remaining charge, for all the pixels, from an accumulation well 4, an accumulation well for transferring 23, and a modulation well 6. After the reset operation, accumulating of charge in the accumulation wells 4 for each sensor cell is started.

The accumulation period (A) following the reset period (R1) is a period for accumulating in the accumulation well 4 the photogenerated charge generated on the photodiode forming area PD by receiving light, each sensor cell moving on to an accumulation mode (M1).

The batch transfer period (T) following the accumulation period (A) is a period for transferring the charge accumulated on each photodiode forming area PD to the carrier pocket area TCP of each sensor cell, simultaneously for all the pixels, that is, simultaneously for all the sensor cells, each sensor cell moving on to a batch transfer mode (M2). The batch transfer operation in the batch transfer period (T) is done by applying simultaneously a first predetermined voltage to the transfer gate 22 of the transfer transistor Tr.

The batch transfer mode (M2) is followed by the above-referenced retention and noise output mode (M3), wherein the charge is retained on the carrier pocket area TCP.

As shown in FIG. 6, the pixel signal readout period (S) following the batch transfer period (T) includes a horizontal blanking period (H) for transferring the charge retained on the carrier pocket area TCP to the modulation transistor forming area TM on each selected line. Specifically, as shown in FIG. 6, in the pixel signal readout period (S), a horizontal blanking period (H) occurs sequentially, or continuously with a time interval.

Figure 7:
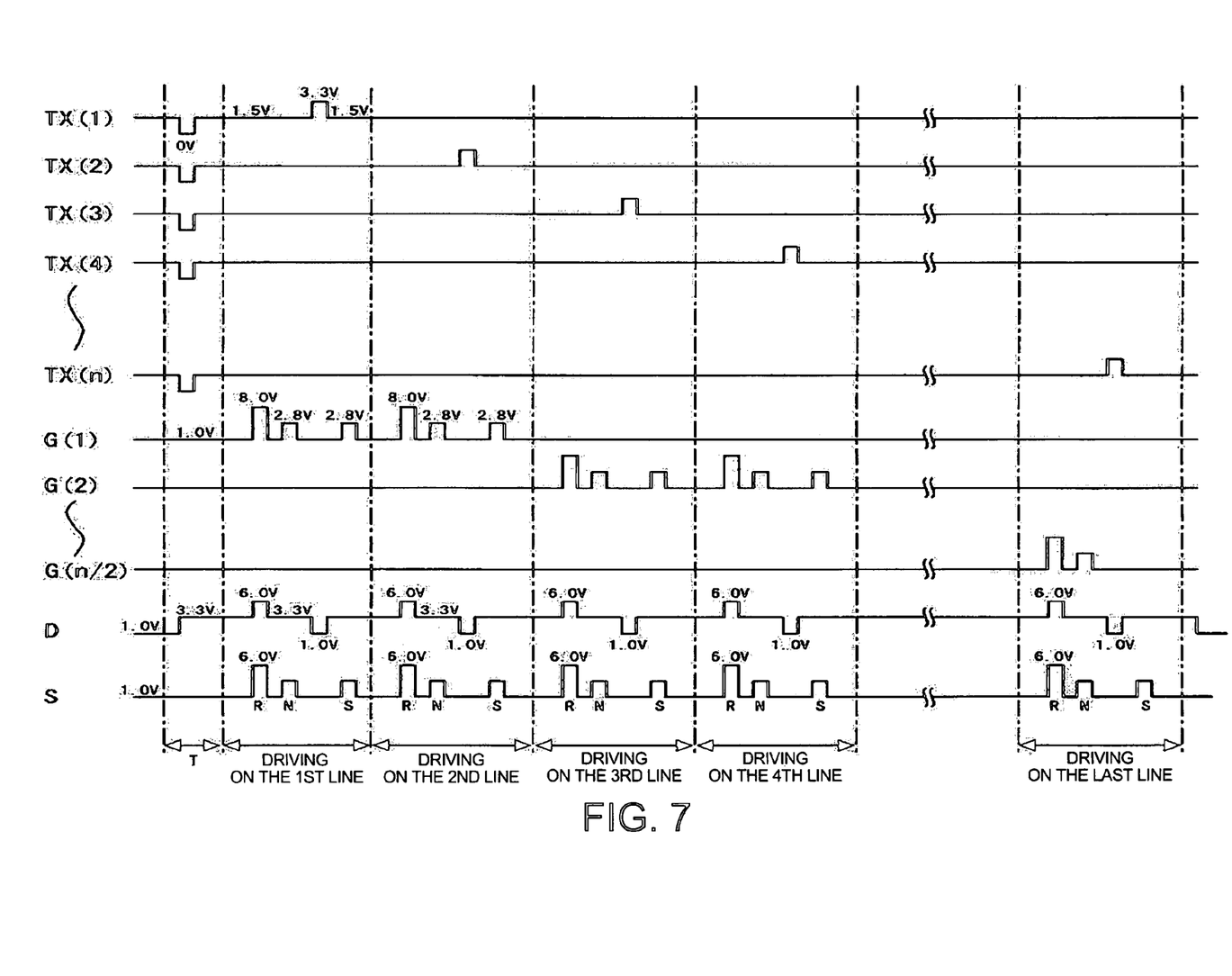
FIG. 7 is a timing chart of a horizontal blanking period of an embodiment of the invention.

FIG. 7 is a timing chart for explaining the batch transfer period (T) and the horizontal blanking period (H). The horizontal blanking period (H) occurs for each selected line. FIG. 7 shows the voltage waveform to be applied onto the transfer gate 22 of the transfer transistor Tr, the gate 5 on the modulation transistor Tm, the source 12, and the drain 13 during the batch transfer period (T) and the horizontal blanking period (H).

The transfer gate line TX(1) shown in FIG. 1 is connected to the transfer gate 22 of the transfer transistor Tr of each cell in the first line. The transfer gate line TX(2) is connected to the transfer gate 22 of the transfer transistor Tr of each cell in the second line. In the same way, a transfer gate line TX(n) is connected to a transfer gate 22 of a transfer transistor Tr of each cell in the n-th line.

The gate line G(1) is connected to the ring gate 5 of the modulation transistor Tm of each cell in the first and second lines. The gate line G(2) is connected to the ring gate 5 of the modulation transistor Tm of each cell in the third and fourth lines. In the same way, a gate line G(k) is connected to a ring gate 5 of a modulation transistor Tm of each cell in the (2k)-th and (2k−1)-th lines.

In the batch transfer, the charge accumulated in the accumulation well 4 is transferred to the carrier pocket 24, the transfer transistor Tr being controlled simultaneously for each pixel. Voltages during the batch transfer period (T) are as follows: changes from 1.5V to 0V on each transfer gate 22, 1.0V on the gate 5, changes from 1.0V to 3.3V on the drain 13, and 1.0V on the source 12.

Next, in the reading out of the pixel signals in the first line, first, as a reset operation, all the charge within the carrier pocket 7 of each modulation transistor Tm corresponding to the first line are discharged by controlling each voltage on the gate line G(1), the drain line D, and the source line S. Specifically, voltages during the reset are as follows: changes from 1.0V to 8V on the gate line G(1), changes from 3.3V to 6.0V on the drain line D, and changes from 1.0V to 6.0V on the source line S.

Next, as a noise component readout operation for the pixel signals in the first line, the reading out of the noise component is done according to the amount of charge remaining in the carrier pocket 7 of each transfer transistor Tm corresponding to the first line by controlling each voltage of the gate line G(1), the drain line D, and the source line S. Specifically, voltages during the reading out of noise component are as follows: changes from 1.0V to 2.8V on the gate line G(1), 3.3V on the drain line D, and the voltage of the noise component is output on the source line S.

Next, as a transfer operation for transferring the charge accumulated on the carrier pocket 24 of the transfer transistor forming area TT to the carrier pocket 7, the charge accumulated in the accumulation well 4 in the first line is transferred to the corresponding carrier pocket 7 by controlling each voltage of the transfer gate line TX(1) and the drain line D. Specifically, voltages during the transfer operation are as follows: changes from 1.5V to 3.3V on the transfer gate line TX(1), changes from 3.3V to 1.0V on the drain line D, and 1.0V on the source line S.

Then, as a readout operation of the signal component of the pixel signals in the first line, the reading out of the signal component is done according to the amount of charge remaining in the carrier pocket 7 of each transfer transistor Tm corresponding to the first line by controlling each voltage of the gate line G(1) and the source line S. Specifically, voltages during the reading out of the signal component are as follows: changes from 1.0V to 2.8V on the gate line G(1) and the voltage of the signal component is output on the source line S. Thus, the pixel signals in the first line are read out.

Now, the reading out of the pixel signals in the second and subsequent lines will be described. The two lines, the second line and the third line, are placed between two gate lines G(1) and G(2) while two transfer gate lines TX(2) and TX(3) are placed between the two lines.

The transfer gate line TX(2) is used to transfer the charge on each photodiode forming area PD in the second line to the carrier pocket 7 of the corresponding modulation transistor Tm. The transfer gate line TX(3) is used to transfer the charge on each photodiode forming area PD in the third line to the carrier pocket 7 of the corresponding modulation transistor Tm.

The gate line G(1) is used to output a pixel signal corresponding to the charge from each photodiode forming area PD in the second line. The gate line G(2) is used to output a pixel signal corresponding to the charge from each photodiode forming area PD in the third line.

Therefore, first, as a reset operation, all the charge within the carrier pocket 7 of each modulation transistor Tm corresponding to the second line are discharged by controlling each voltage of the gate line G(1), the drain line D, and the source line S. Specifically, voltages during the reset are as follows: changes from 1.0V to 8V on the gate line G(1), changes from 3.3V to 6.0V on the drain line D, and changes from 1.0V to 6.0V on the source line S.

Then, as a readout operation of the noise component of the pixel signal in the second line, the reading out of the noise component is done according to the amount of charge remaining in the carrier pocket 7 of each modulation transistor Tm corresponding to the second line by controlling each voltage of the gate line G(1), the drain line D, and the source line S. Specifically, voltages during the reading out of the noise component are as follows: changes from 1.0V to 2.8V on the gate line G(1), 3.3V on the drain line D, and the voltage of the noise component is output on the source line S.

Then, as a transfer operation of the charge accumulated on the carrier pocket 24 of the transfer transistor forming area TT to the carrier pocket 7, the charge accumulated on the carrier pocket 24 in the second line is transferred to each corresponding carrier pocket 7 by controlling each voltage of the transfer gate line TX(2) and the drain line D. Specifically, voltages during the transfer operation are as follows: changes from 1.5V to 3.3V on the transfer gate line TX(2), changes from 3.3V to 1.0V on the drain line D, and 1.0V on the source line S.

Then, as a readout operation of the signal component of the pixel signal in the second line, the reading out of the signal component is done according to the amount of charge remaining in the carrier pocket 7 of each modulation transistor Tm in the second line by controlling each voltage of the gate line G(1) and the source line S. Specifically, voltages during the reading out of the signal component are as follows: changes from 1.0V to 2.8V on the gate line G(1) and the voltage of the signal component is output on the source line S.

Next, as a reset operation in the case of reading out the photogenerated charge of the photodiode forming area PD in the third line, the charge in the carrier pocket 7 of each modulation transistor Tm in the third line are discharged by controlling each voltage of the gate line G(2), the drain line D, and the source line S. Specifically, voltages during the reset are as follows: changes from 1.0V to 8V on the gate line G(2), changes from 3.3V to 6.0V on the drain line D, and changes from 1.0V to 6.0V on the source line S.

Next, as a readout operation of the noise component of the pixel signal in the third line, the reading out of the noise component is done according to the amount of charge remaining in the carrier pocket 7 of each modulation transistor Tm in the third line by controlling each voltage of the gate line G(2), the drain line D and the source line S. Specifically, voltages during the reading out of the noise component are as follows: changes from 1.0V to 2.8V on the gate line G(2), 3.3V on the drain line D, and the voltage of the noise component is output on the source line S.

Then, as a transfer operation of the charge accumulated on the carrier pocket 24 of the transfer transistor forming area TT to the carrier pocket 7, the charge accumulated on the carrier pocket 24 in the third line is transferred to each corresponding carrier pocket 7 by controlling each voltage of the transfer gate line TX(3) and the drain line D. Specifically, voltages during the transfer operation are as follows: changes from 1.5V to 3.3V on the transfer gate line TX(3), changes from 3.3V to 1.0V on the drain line D, and 1.0V on the source line S.

Then, in the same way, as a readout operation of the signal component of the pixel signal in the third line, the reading out of the signal component is done according to the amount of charge remaining in the carrier pocket 7 of each modulation transistor Tm in the third line by controlling each voltage of the gate line G(2) and the source line S. Specifically, voltages during the reading out of the signal component are as follows: changes from 1.0V to 2.8V on the gate line G(2), 3.3V on the drain line D and the voltage of signal component is output on the source line S. Thus, the pixel signals in the second and the third lines are read out.

Next, in the same way, as a reset operation in the case of reading out the photogenerated charge of the photodiode forming area PD in the fourth line, the charge in the carrier pocket 7 of each modulation transistor Tm in the fourth line are discharged by controlling each voltage of the gate line G(2), the drain line D, and the source line S. Specifically, voltages during the reset are as follows: changes from 1.0V to 8V on the gate line G(2), changes from 3.3V to 6.0V on the drain line D, and changes from 1.0V to 6.0V on the source line S.

Next, as a readout operation of the noise component of the pixel signal in the fourth line, the reading out of the noise component is done according to the amount of charge remaining in the carrier pocket 7 of each modulation transistor Tm in the fourth line by controlling each voltage of the gate line G(2), the drain line D and the source line S. Specifically, voltages during the reading out of the noise component are as follows: changes from 1.0V to 2.8V on the gate line G(2), 3.3V on the drain line D, and the voltage of the noise component is output on the source line S.

Then, as a transfer operation of the charge accumulated on the carrier pocket 24 of the transfer transistor forming area TT to the carrier pocket 7, the charge accumulated on the carrier pocket 24 in the fourth line is transferred to each corresponding carrier pocket 7 by controlling each voltage of the transfer gate line TX(4) and the drain line D. Specifically, voltages during the transfer operation are as follows: changes from 1.5V to 3.3V on the transfer gate line TX(4), changes from 3.3V to 1.0V on the drain line D, and 1.0V on the source line S.

Then, in the same way, as a readout operation of the signal component of the pixel signal in the fourth line, the reading out of the signal component is done according to the amount of charge remaining in the carrier pocket 7 of each modulation transistor Tm in the fourth line by controlling each voltage of the gate line G(2) and the source line S. Specifically, voltages during the reading out of the signal component are as follows: changes from 1.0V to 2.8V on the gate line G(2) and the voltage of the signal component is output on the source line S. Then, as a reset operation in the case of reading out the photogenerated charge of the photodiode forming area PD in the fifth line, the charge in the carrier pocket 7 of each modulation transistor Tm in the fifth line are discharged by controlling each voltage of the gate line G(3), the drain line D, and the source line S. Specifically, voltages during the reset are as follows: changes from 1.0V to 8V on the gate line G(3), changes from 3.3V to 6.0V on the drain line D, and changes from 1.0V to 6.0V on the source line S.

Next, as a readout operation of the noise component of the pixel signal in the fifth line, the reading out of the noise component is done according to the amount of charge remaining in the carrier pocket 7 of each modulation transistor Tm in the fifth line by controlling each voltage of the gate line G(3), the drain line D and the source line S. Specifically, voltages during the reading out of the noise component are as follows: changes from 1.0V to 2.8V on the gate line G(3), 3.3V on the drain line D, and the voltage of the noise component is output on the source line S.

Then, as a transfer operation of the charge accumulated on the carrier pocket 24 of the transfer transistor forming area TT to the carrier pocket 7, the charge accumulated on the carrier pocket 24 in the fifth line is transferred to each corresponding carrier pocket 7 by controlling each voltage of the transfer gate line TX(5) and the drain line D. Specifically, voltages during the transfer operation are as follows: changes from 1.5V to 3.3V on the transfer gate line TX(5), changes from 3.3V to 1.0V on the drain line D, and 1.0V on the source line S.

Then, in the same way, as a readout operation of the signal component of the pixel signal in the fifth line, the reading out of the signal component is done according to the amount of charge remaining in the carrier pocket 7 of each modulation transistor Tm in the fifth line by controlling each voltage of the gate line G(3) and the source line. S. Specifically, voltages during the reading out of the signal component are as follows: changes from 1.0V to 2.8V on the gate line G(3) and the voltage of the signal component is output on the source line S. Thus, the pixel signals in the fourth and the fifth lines are read out.

Then, the signal component is sequentially read out in the same way until the n-th line, or the last line.

Therefore, as described above, a CDS feature is achieved by first reading out the noise component and then reading out the signal component.

As described above, according to a solid state imaging system of the embodiment, the noise component and the signal component based on the transferred photogenerated charge are read out from the modulation transistor Tm by controlling the voltage of the ring gate 5 that is placed corresponding to a pair of transfer transistor forming areas TT, which is placed side-by-side in one direction of the matrix. Further, the photogenerated charge is transferred from one of the two carrier pockets 24 of the pair of transfer transistors, which is placed side-by-side in one direction of the matrix, to the carrier pocket 7.

In this way, a synchronous electronic shutter as well as a CDS feature can be achieved according to a solid state imaging system of the embodiment. Further, according to a solid state imaging system of the embodiment, downsizing of a cell pitch can be achieved on a substrate modulation sensor because one ring gate is placed for each two photodiode forming areas PD.

Further, transferring can be controlled separately for the two photodiode forming areas PD because a transfer gate line is placed for each line.

The invention is not limited to the above-referenced embodiment. Any change and alteration is acceptable as far as the purpose of the invention is not altered.

What is claimed is:

1. A solid state imaging system having, in a substrate, a plurality of accumulation wells for accumulating photogenerated charge generated on a photoelectric conversion area according to an incident light, the plural photoelectric conversion areas being aligned on the substrate in a two-dimensional matrix, the solid state imaging system comprising:

a plurality of photoelectric conversion areas that are placed in pairs for each pixel of the solid state imaging system;

a plurality of amplifying units that are placed one by one for every pair of photoelectric conversion areas, each of which is placed side-by-side in one direction of the two-dimensional matrix, for outputting a pixel signal according to the photogenerated charge retained in a floating diffusion area, a plurality of transfer controlling elements that are placed in pairs for each pair of the photoelectric conversion areas for controlling the transfer of the photogenerated charge by changing a potential barrier of a photogenerated charge transfer route between each of the accumulation wells in the pair of photoelectric conversion areas and the corresponding floating diffusion area, and a plurality of transfer gate lines that are connected to each of the transfer controlling elements in the plural photoelectric conversion areas that are aligned in the other direction of the two-dimensional matrix, wherein each of the plural transfer controlling elements has a transfer gate placed on a substrate surface via an insulating film and a charge retention area for retaining the photogenerated charge in the substrate and beneath the transfer gate, while the plural amplifying units are respectively a transistor and the form of a gate of the transistor is approximately ring-shaped respectively, each gate being placed on a carved-out part of each pair of the transfer gates, each of which is placed side-by-side in one direction of the two-dimensional matrix in a manner of being interposed at least in part.

2. The solid state imaging system according to claim 1, wherein the amplifying unit is a modulation transistor that outputs the pixel signal according to the charge while a threshold voltage of a channel is controlled by the charge retained in the floating diffusion area.

3. The solid state imaging system according to claim 1, wherein a diffusion layer, which works as a transfer route between the floating diffusion area and the charge retention area, is placed beneath other diffusion layers of the substrate.

4. The solid state imaging system according to claim 1, wherein a discharging unit is included for discharging an unnecessary charge in the accumulation wells.

5. A solid state imaging system having, in a substrate, a plurality of accumulation wells for accumulating photogenerated charge generated on a photoelectric conversion area according to an incident light, the plural photoelectric conversion areas being aligned on the substrate in a two-dimensional matrix, the solid state imaging system comprising:

a plurality of photoelectric conversion areas that are placed in pairs for each pixel of the solid state imaging system:

a plurality of amplifying units that are placed one by one for every pair of photoelectric conversion areas, each of which is placed side-by-side in one direction of the twodimensional matrix, for outputting a pixel signal according to the photogenerated charge retained in a floating diffusion area a plurality of transfer controlling elements that are placed in pairs for each pair of the photoelectric conversion areas for controlling the transfer of the photogenerated charge by changing a potential barrier of a photogenerated charge transfer route between each of the accumulation wells in the pair of photoelectric conversion areas and the corresponding floating diffusion area, and a plurality of transfer gate lines that are connected to each of the transfer controlling elements in the plural photoelectric conversion areas that are aligned in the other direction of the two-dimensional matrix, wherein each of the plural transfer controlling elements has a transfer gate placed on a substrate surface via an insulating film and a charge retention area for retaining the photogenerated charge in the substrate and beneath the transfer gate, while the plural amplifying units are respectively a transistor and the form of a gate of the transistor is approximately ring-shaped respectively, each gate being placed on a carved-out part of each pair of the transfer gates, each of which is placed side-by-side in one direction of the two-dimensional matrix in a manner of being interposed at least in part, wherein the solid state imaging system also including:

accumulating in the accumulation wells the photogenerated charge, simultaneously for all the pixels, by controlling the potential barrier of the transfer route with the transfer controlling elements as a way of at least preventing it from flowing into the charge retention area via the transfer route, first transferring of the photogenerated charge accumulated on the accumulation wells to the charge retention area, simultaneously for all the pixels, by controlling the potential barrier of the transfer route with the transfer controlling elements, first reading out of a noise component from the transistor by controlling the voltage on the two gates that are placed corresponding to the pair of photoelectric conversion areas in one direction of the matrix, second transferring of the photogenerated charge from one of the two charge retention areas of the two transfer controlling elements corresponding to the pair of photoelectric conversion areas to the floating diffusion area in one direction of the matrix, and second reading out of a signal component from the transistor according to the transferred photogenerated charge by controlling the voltage on the gates that are placed corresponding to the pair of photoelectric conversion areas in one direction of the matrix.

* * * * *